US 8,847,301 B2

(12) United States Patent
Onda

(10) Patent No.: US 8,847,301 B2
(45) Date of Patent: Sep. 30, 2014

(54) SEMICONDUCTOR DEVICE AND METHOD FOR MANUFACTURING SEMICONDUCTOR DEVICE

(75) Inventor: Takayuki Onda, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/984,067

(22) PCT Filed: Feb. 21, 2012

(86) PCT No.: PCT/JP2012/001164
§ 371 (c)(1),
(2), (4) Date: Aug. 7, 2013

(87) PCT Pub. No.: WO2012/127781
PCT Pub. Date: Sep. 27, 2012

(65) Prior Publication Data
US 2013/0313624 A1 Nov. 28, 2013

(30) Foreign Application Priority Data

Mar. 24, 2011 (JP) ................................. 2011-066604

(51) Int. Cl.
*H01L 27/105* (2006.01)
*H01L 21/8239* (2006.01)
*H01L 27/115* (2006.01)
*H01L 29/78* (2006.01)
*H01L 21/28* (2006.01)

(52) U.S. Cl.
CPC .......... *H01L 29/78* (2013.01); *H01L 27/11519* (2013.01); *H01L 27/11524* (2013.01); *H01L 21/28008* (2013.01)

USPC .......................................... 257/314; 438/257

(58) Field of Classification Search
USPC .......................... 257/314–326; 438/257–267
See application file for complete search history.

(56) References Cited

U.S. PATENT DOCUMENTS

| 2007/0296021 A1 | 12/2007 | Sugiyama et al. |
| 2012/0083112 A1 | 4/2012 | Sugiyama et al. |

FOREIGN PATENT DOCUMENTS

| JP | 2000-031304 A | 1/2000 | |
| JP | 2004-064012 A | 2/2004 | |
| JP | 2007-281506 A | 10/2007 | |
| JP | 2007-335787 A | 12/2007 | |
| JP | 2009-141248 A | 6/2009 | |
| JP | 2010-123604 A | 6/2010 | |
| JP | 2010123604 | * 6/2010 | .......... H01L 21/8247 |

OTHER PUBLICATIONS

International Search Report, PCT/JP2012/001164, filed Apr. 3, 2012.

* cited by examiner

*Primary Examiner* — Daniel Shook
(74) *Attorney, Agent, or Firm* — Sughrue Mion, PLLC

(57) ABSTRACT

A first connection portion and a second connection portion connect a first control gate to a second control gate, and are separated from each other. The first control gate includes a first disconnection portion between the first connection portion and a source diffusion layer closest to the first connection portion. The second control gate includes a second disconnection portion between the second connection portion and the source diffusion layer closest to the second connection portion. A first word gate and a second word gate are not disconnected in portions overlapping the first disconnection portion and the second disconnection portion.

9 Claims, 15 Drawing Sheets

FIG. 8
(a)
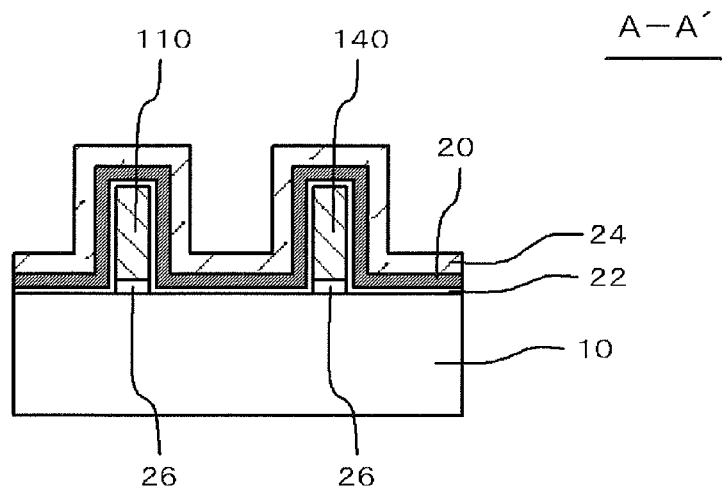
(b)
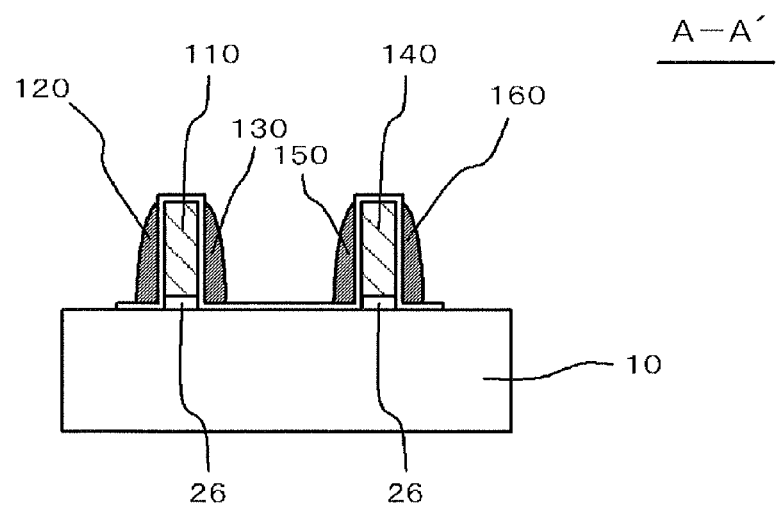

FIG. 12
(a)
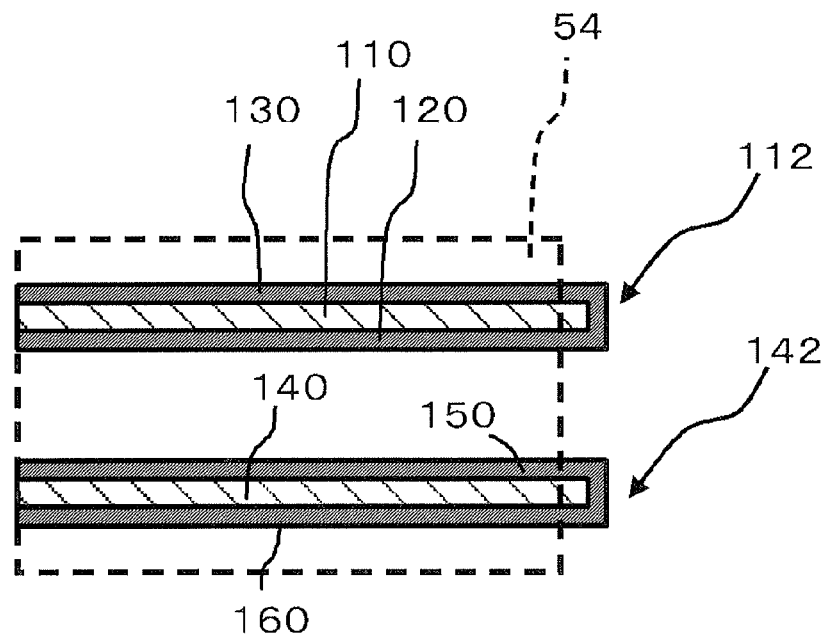
(b)
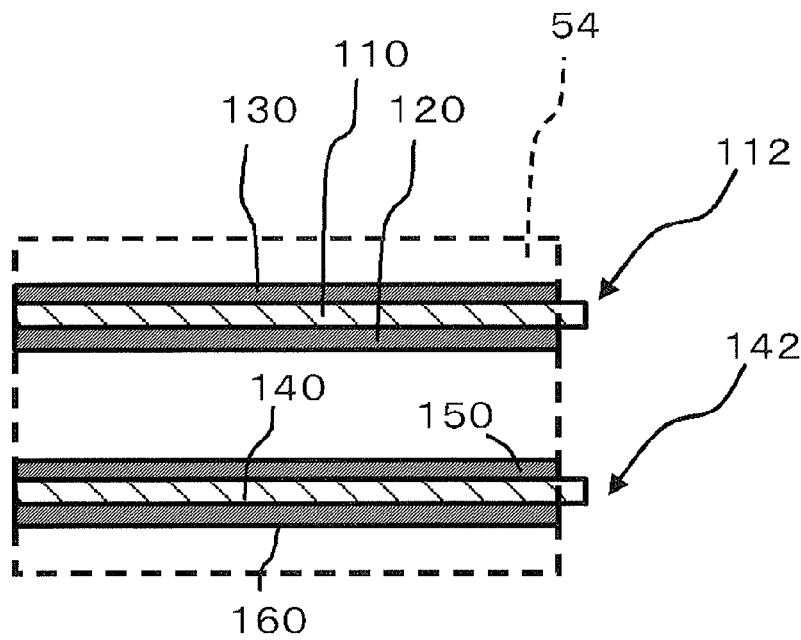

SEMICONDUCTOR DEVICE AND METHOD FOR MANUFACTURING SEMICONDUCTOR DEVICE

CROSS REFERENCE TO RELATED APPLICATIONS

This application is a National Stage of International Application No. PCT/JP2012/001164 filed Feb. 21, 2012, claiming priority based on Japanese Patent Application No. 2011-066604 filed Mar. 24, 2011, the contents of all of which are incorporated herein by reference in their entirety.

TECHNICAL FIELD

The present invention relates to a semiconductor device and a method for manufacturing a semiconductor device having a nonvolatile memory.

BACKGROUND ART

In nonvolatile memories, since power is not required for the holding of information, the applications thereof are increasingly expanding. Techniques relevant to nonvolatile memories include, for example, structures disclosed in Patent Documents 1 to 3.

Patent Document 1 discloses the following technique. Two word gates extend parallel to each other, and control gate electrodes are formed at the lateral sides facing each other in the lateral sides of these word gates. A contact is formed in each of the control gate electrodes.

Patent Document 2 discloses the following technique. Two word gates extend parallel to each other, and control gate electrodes are formed at both the lateral sides in these word gates. The control electrodes facing each other are connected to each other by a connection layer of which a portion is left without being separated during the manufacturing thereof. A contact for a control gate is formed on the connection layer.

However, in the technique disclosed in Patent Document 2, the control electrodes facing each other are connected to the same contact with the connection layer interposed therebetween. For this reason, a voltage is also applied to the control electrode which is not selected, and thus there is the possibility of erroneous writing being generated. On the other hand, in a technique disclosed in Patent Document 3, both a gate electrode and a control gate electrode are cut off in the same place, thereby allowing the generation of erroneous writing to be suppressed.

RELATED DOCUMENTS

Patent Documents

[Patent Document 1] Japanese Unexamined Patent Publication No. 2007-281506
[Patent Document 2] Japanese Unexamined Patent Publication No. 2007-335787
[Patent Document 3] Japanese Unexamined Patent Publication No. 2010-123604

DISCLOSURE OF THE INVENTION

Problem to be Solved by the Invention

However, in the technique disclosed in Patent Document 3, a word gate is also cut off together with the control gate electrode. For this reason, it is necessary to increase the number of contacts connected to the word gate, and thus a reduction in the size of a semiconductor device is obstructed.

Means for Solving Problem

According to an aspect of the invention, there is provided a semiconductor device including: a substrate; a first word gate formed over the substrate; a second word gate, formed over the substrate, which extends parallel to the first word gate; a first control gate formed at a lateral side facing the second word gate in the first word gate; a second control gate formed at a lateral side facing the first word gate in the second word gate; a first connection portion and a second connection portion, formed over the substrate, which connect the first control gate and the second control gate, and are separated from each other; and at least one diffusion layer, formed in a region located between the first connection portion and the second connection portion in the substrate, which extends from the first control gate to the second control gate. Herein, the first control gate includes a first disconnection portion between the first connection portion and the diffusion layer closest to the first connection portion, and the second control gate includes a second disconnection portion between the second connection portion and the diffusion layer closest to the second connection portion. In addition, the first control gate is not disconnected in a portion overlapping the first disconnection portion, and the second control gate is not disconnected in a portion overlapping the second disconnection portion.

According to the aspect of the invention, the first control gate includes the first disconnection portion, and the second control gate includes the second disconnection portion. Therefore, it is possible to suppress erroneous writing into the memory cell. In addition, the first word gate is not disconnected in the portion overlapping the first disconnection portion, and the second word gate is not disconnected in the portion overlapping the second disconnection portion. For this reason, as compared with a case where the first word gate and the second word gate are disconnected, it is possible to reduce the number of contacts connected to the first word gate and the second word gate. Therefore, it is possible to reduce the size of the semiconductor device while suppressing erroneous writing into the memory cell.

According to the invention, there is provided a method for manufacturing a semiconductor device, including: forming a first word gate and a second word gate over a substrate; forming a conductive film over the substrate, the first word gate, and the second word gate; forming a first mask film over the conductive film, and etching the conductive film using the first mask film as a mask, to form a first control gate located at a lateral side facing the second word gate in the first word gate, a second control gate located at a lateral side facing the first word gate in the second word gate, and a first connection portion and a second connection portion that connect the first control gate and the second control gate and are separated from each other; forming a second mask film that covers the first connection portion and the second connection portion, and partially covers the first control gate and the second control gate; performing etching using the second mask film as a mask, to form a first disconnection portion located between the first connection portion and the second connection portion in the first control gate, form a second disconnection portion located between the first connection portion and the second connection portion in the second control gate, and not to disconnect the first word gate and the second word gate; and introducing impurities selectively in a region located between the first connection portion and the second connection portion in the substrate, to form at least one diffusion layer extending from the first control gate to the second control gate, wherein the first disconnection portion is located between the first connection portion and the diffusion layer closest to the first connection portion, and the second disconnection portion is located between the second connection portion and the diffusion layer closest to the second connection portion.

Advantage of the Invention

According to an aspect of the invention, it is possible to reduce the size of a semiconductor device while suppressing erroneous writing into a memory cell.

BRIEF DESCRIPTION OF THE DRAWINGS

The above-mentioned objects, other objects, features and advantages will be made clearer from the preferred embodiments described below, and the following accompanying drawings.

FIG. 8 is a cross-sectional view taken along line A-A' of FIGS. 9 and 11.

FIG. 12 is a plan view illustrating processes shown in FIGS. 10 and 11.

DESCRIPTION OF EMBODIMENTS

Figure 1:
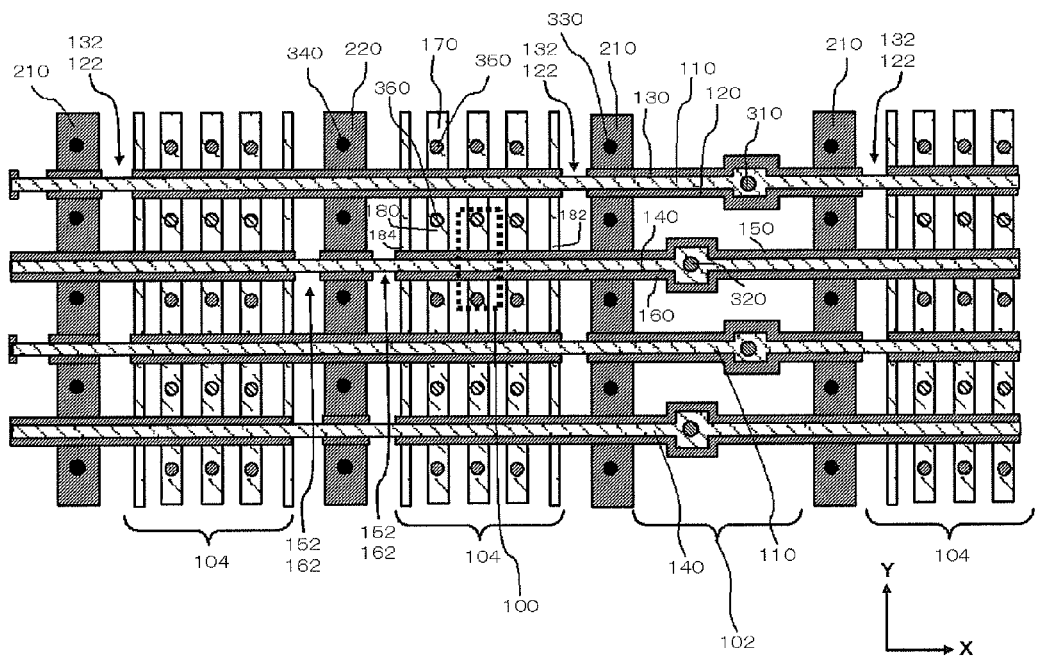
FIG. 1 is a plan view illustrating a configuration of a semiconductor device according to a first embodiment.

Hereinafter, embodiments of the invention will be described with reference to the accompanying drawings. In all the drawings, like elements are referenced by like reference numerals and descriptions thereof will not be repeated.

First Embodiment

FIG. 1 is a plan view illustrating a configuration of a semiconductor device according to a first embodiment. The semiconductor device includes a substrate 10 (not shown in FIG. 1), a first word gate 110, a second word gate 140, a first control gate 120, a second control gate 150, a first connection portion 210, a second connection portion 220, and at least one source diffusion layer 180. The substrate 10 is, for example, a semiconductor substrate such as a silicon substrate. The first word gate 110 is formed on the substrate 10. The second word gate 140 is formed on the substrate 10, and extends parallel to the first word gate 110. The first control gate 120 is formed at the lateral side facing the second word gate 140 in the first word gate 110. The second control gate 150 is formed at the lateral side facing the first word gate 110 in the second word gate 140. The first connection portion 210 and the second connection portion 220 are formed on the substrate 10, and each of the connection portions connects the first control gate 120 to the second control gate 150 and is separated from each other. At least one source diffusion layer 180 is formed in a region located between the first connection portion 210 and the second connection portion 220 in the substrate 10, and extends from the first control gate 120 to the second control gate 150 when seen in a plan view.

The first control gate 120 includes a first disconnection portion 122 between the first connection portion 210 and the source diffusion layer 180 closest to the first connection portion 210. In addition, the second control gate 150 includes a second disconnection portion 152 between the second connection portion 220 and the source diffusion layer 180 closest to the second connection portion 220. The first word gate 110 is not disconnected in a portion overlapping the first disconnection portion 122. In addition, the second word gate 140 is not disconnected in a portion overlapping the second disconnection portion 152. Hereinafter, a detailed description will be given.

The first connection portion 210 and the second connection portion 220 are formed integrally with the first control gate 120 and the second control gate 150. In addition, a plurality of source diffusion layers 180 are formed between the first connection portion 210 and the second connection portion 220. In addition, a dummy diffusion layer 182 is formed between the source diffusion layer 180 closest to the first connection portion 210 and the first connection portion 210, and a dummy diffusion layer 184 is formed between the second connection portion 220 and the source diffusion layer 180 closest to the second connection portion 220. Meanwhile, in FIG. 1, the dummy diffusion layers 182 and 184 are formed, but these dummy diffusion layers may not be provided.

In the example shown in the drawing, a third control gate 130 is formed at the lateral side where the first control gate 120 is not formed in the first word gate 110. In addition, a fourth control gate 160 is formed at the lateral side where the second control gate 150 is not formed in the second word gate 140. The third control gate 130 includes a third disconnection portion 132 at the same position as that of the first disconnection portion 122 in a direction in which the first control gate 120 extends. In addition, the fourth control gate 160 includes a fourth disconnection portion 162 at the same position as that of the second disconnection portion 152 in a direction in which the second control gate 150 extends.

The substrate 10 includes a bit diffusion layer 170 in a region located at the opposite side to the source diffusion layer 180 with the first word gate 110 interposed therebetween. In addition, the substrate 10 also includes the bit diffusion layer 170 at the opposite side to the source diffusion layer 180 with the second word gate 140 interposed therebetween. These bit diffusion layers 170 are formed so as to extend on the same straight line as the source diffusion layer 180. One memory cell 100 is formed by the source diffusion layer 180, the bit diffusion layer 170, and the word gate and the control gate located therebetween. A plurality of memory cells 100 are formed in an array.

In addition, in the example shown in the drawing, the first word gate 110 and the second word gate 140 are repeatedly disposed in this order. The first control gate 120 and the third control gate 130 are formed in each of the first word gates 110, and the second control gate 150 and the fourth control gate 160 are formed in each of the second word gates 140. The first connection portion 210 (third connection portion) and the second connection portion 220 (fourth connection portion) are also formed between the third control gate 130 and the fourth control gate 160 facing each other. The first connection portion 210 and the second connection portion 220 connect the third control gate 130 and the fourth control gate 160 to each other. The first connection portion 210 and the second connection portion 220 are formed integrally with the third control gate 130 and the fourth control gate 160. A plurality of first connection portions 210 are disposed so as to form the same straight line, and a plurality of second connection portions 220 are also disposed so as to form the same straight line.

In addition, when seen along the extending direction of the first word gate 110, the plurality of first connection portions 210 and second connection portions 220 are alternately provided. The source diffusion layer 180 is formed in each memory cell region 104 located between the first connection portion 210 and the second connection portion 220. The first disconnection portion 122 and the third disconnection portion 132 are provided with respect to each of the plurality of first connection portions 210, and the second disconnection portion 152 and the fourth disconnection portion 162 are provided with respect to each of the plurality of second connection portions 220. That is, the first disconnection portion 122, the third disconnection portion 132, the second disconnection portion 152, and the fourth disconnection portion 162 are formed for each memory cell region 104.

As stated above, in the example shown in the drawing, the first word gate 110 and the second word gate 140 extend in a first direction (X direction in the drawing). The first word gate 110 and the second word gate 140 are repeatedly disposed in a second direction (Y direction in the drawing) perpendicular to the first direction. The bit diffusion layer 170 or the source diffusion layer 180 is disposed between the first connection portion 210 and the second connection portion 220. When seen along a straight line extending in the Y direction, the bit diffusion layer 170 and the source diffusion layer 180 are alternately disposed.

Meanwhile, a first word contact 310 is formed on the first word gate 110, and a second word contact 320 is formed on the second word gate 140. The first word contact 310 and the second word contact 320 are disposed in a contact formation region 102 in which the memory cell 100 is not formed. The first word contact 310 and the second word contact 320 are disposed so as to alternate with each other in the extending direction of the first word gate 110. With such an arrangement, even when the width of the portion to which the first word contact 310 is connected in the first word gate 110 is increased, and the width of the portion to which the second word contact 320 is connected in the second word gate 140 is increased, it is possible to suppress an increase in the distance between the first word gate 110 and the second word gate 140.

Further, a first control contact 330 is formed on each of the first connection portions 210, and a second control contact 340 is formed on each of the second connection portions 220. In addition, a bit contact 350 is formed on each of the bit diffusion layers 170, and a source contact 360 is formed on each of the source diffusion layers 180.

In the example shown in the drawing, a region interposed between the first connection portion 210 and the second connection portion 220 can be defined as the memory cell region 104. A plurality of memory cell regions 104 are disposed in a layout which is line-symmetric when based on one contact formation region 102. In addition, the memory cell regions 104 which are adjacent to each other with the second connection portion 220 interposed therebetween have layouts which are line-symmetric to each other based on the second connection portion 220.

Figure 2:
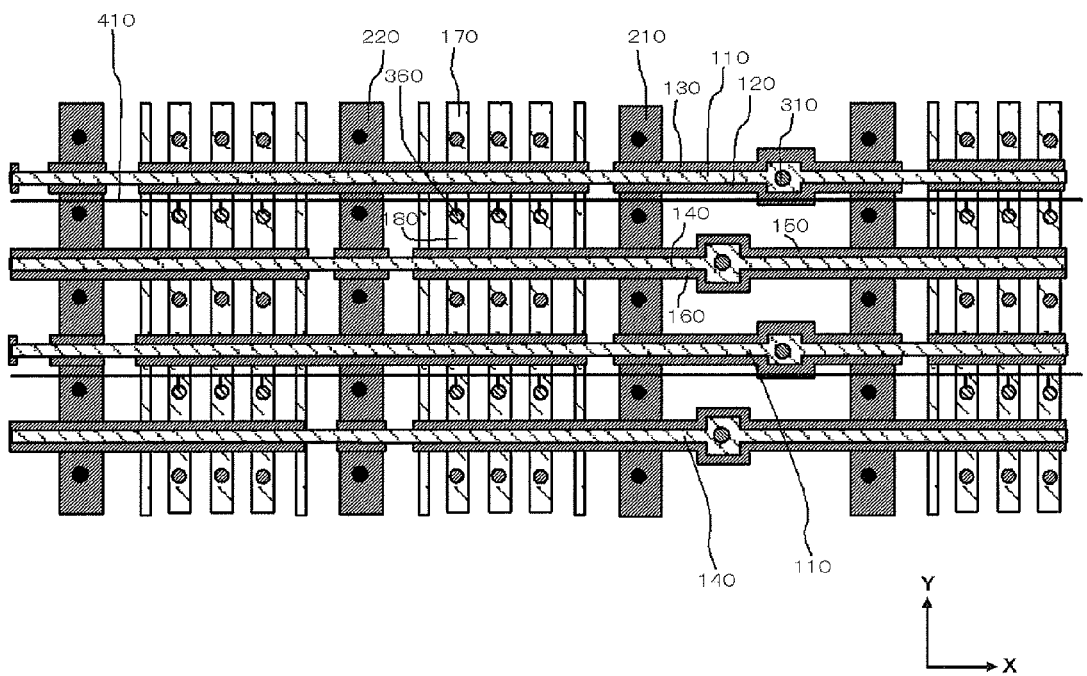
FIG. 2 is a diagram illustrating an interconnect example of source interconnects.

FIG. 2 is a diagram illustrating an interconnect example of source interconnects 410. In the example shown in the drawing, a plurality of source interconnects 410 extend in the X direction. One source interconnect 410 is connected to a plurality of source contacts 360 which are located at the same place in the Y direction.

Figure 3:
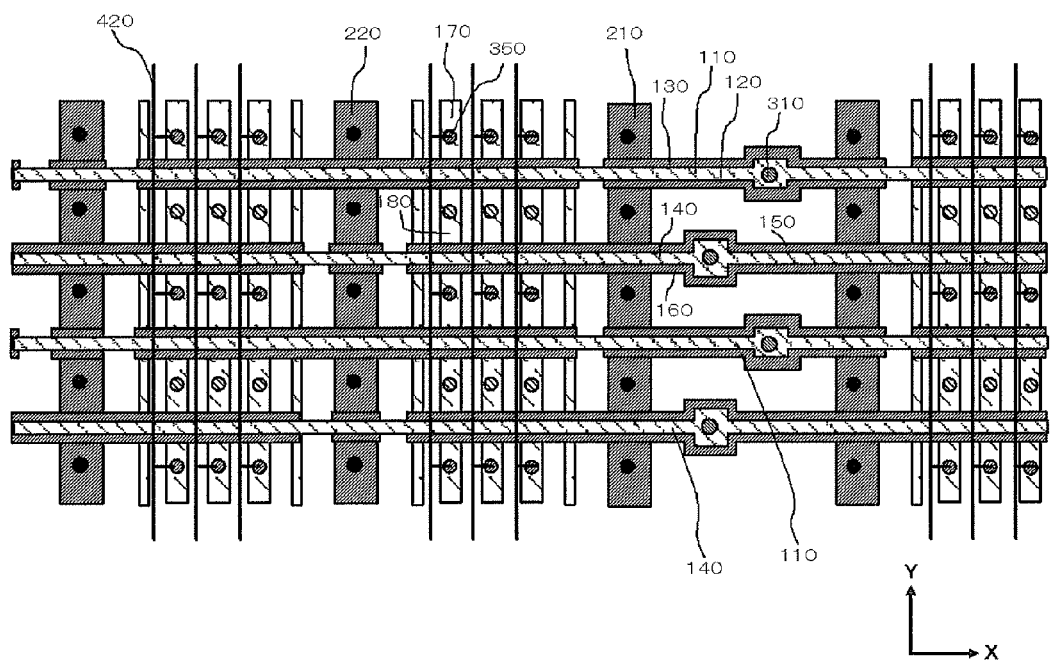
FIG. 3 is a diagram illustrating an interconnect example of bit interconnects.

FIG. 3 is a diagram illustrating an interconnect example of bit interconnects 420. In the example shown in the drawing, a plurality of bit interconnects 420 extend in a direction perpendicular to the source interconnect 410, that is, the Y direction. One bit interconnect 420 is connected to a plurality of bit contacts 350 which are located at the same place in the X direction.

Figure 4:
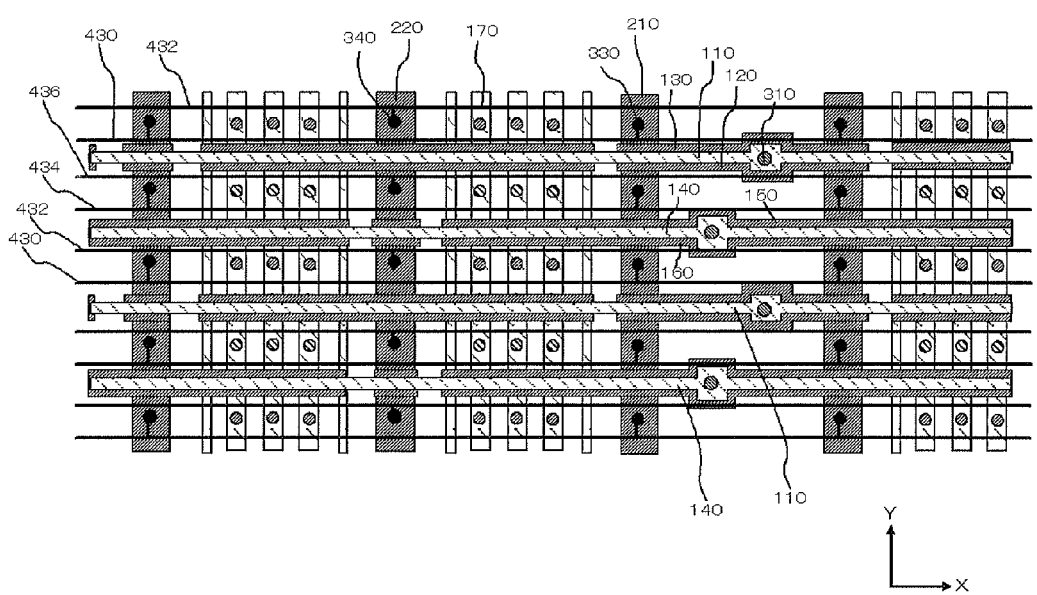
FIG. 4 is a diagram illustrating an interconnect example of control interconnects.

FIG. 4 is a diagram illustrating an interconnect example of control interconnects. In the example shown in the drawing, a first control interconnect 430, a second control interconnect 432, a third control interconnect 434, and a fourth control interconnect 436 extend in a direction parallel to the source interconnect 410, that is, the X direction. The first to fourth control interconnects 430, 432, 434, and 436 are repeatedly disposed. Each of the first control interconnect 430 and the third control interconnect 434 is connected to a plurality of first control contacts 330 which are located at the same place in the Y direction. In addition, each of the second control interconnect 432 and the fourth control interconnect 436 is connected to a plurality of second control contacts 340 which are located at the same place in the Y direction.

However, the layouts of the first control contacts 330 and the second control contacts 340 which are shown in the drawing are merely examples. For example, the first control contact 330 connected to the first control interconnect 430 and the second control contact 340 connected to the fourth control interconnect 436 may be located at the same place in the Y direction. In this case, additionally, the second control contact 340 connected to the second control interconnect 432 and the first control contact 330 connected to the third control interconnect 434 may be located at the same place in the Y direction.

In addition, a case is also considered in which only one control gate out of two control gates included in the memory cell 100 shown in FIG. 1 is caused to function, and the other control gate is not caused to function. In such a case, for example, it is considered that the two control gates (for example, first control gate 120 and second control gate 150) facing each other are caused to function, and the remaining two control gates (for example, third control gate 130 and fourth control gate 160) are not caused to function. In this case, two control gates which do not function may be connected to the same control interconnect.

Figure 5:
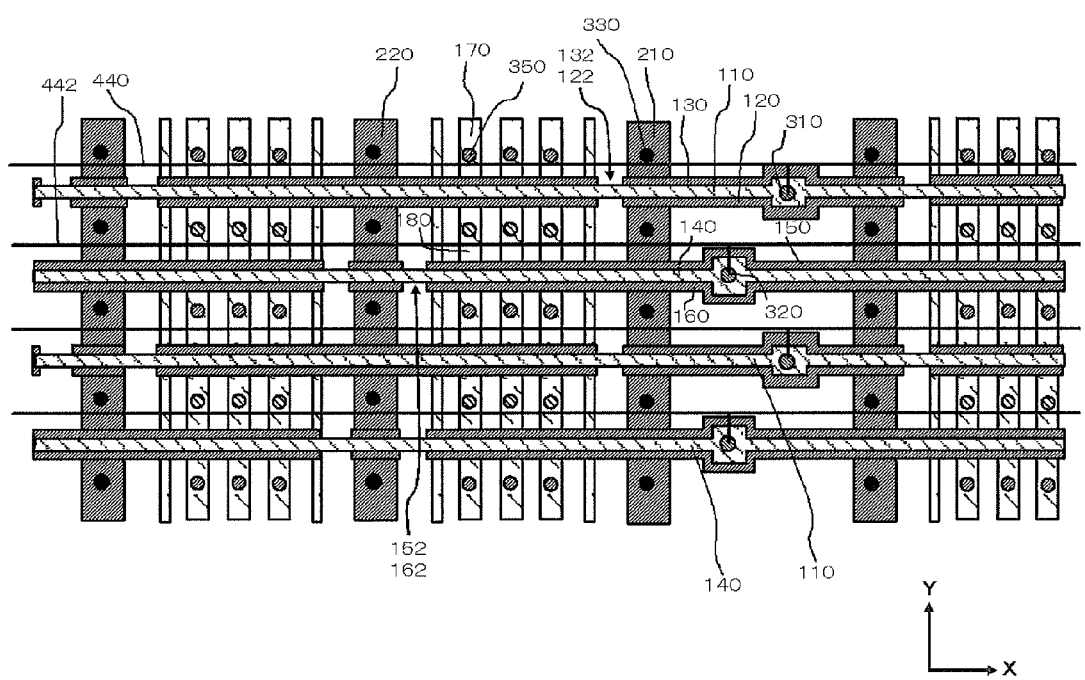
FIG. 5 is a diagram illustrating an interconnect example of word interconnects.

FIG. 5 is a diagram illustrating an interconnect example of word interconnects. In the example shown in the drawing, a first word interconnect 440 and a second word interconnect 442 extend in a direction parallel to the source interconnect 410, that is, the X direction. One first word interconnect 440 is connected to a plurality of first word contacts 310 which are located at the same place in the Y direction. In addition, one second word interconnect 442 is connected to a plurality of second word contacts 320 which are located at the same place in the Y direction.

Figure 6:
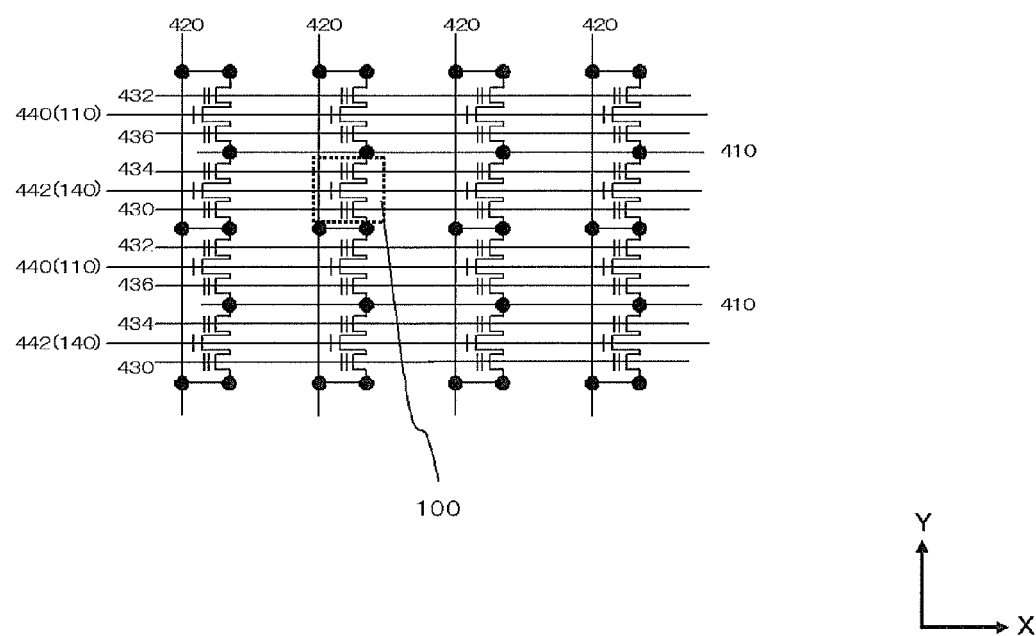
FIG. 6 is a circuit diagram of the semiconductor device shown in FIGS. 1 to 5.

FIG. 6 is a circuit diagram of the semiconductor device shown in FIGS. 1 to 5. When a specific memory cell 100 is selected, a voltage is applied to the first word interconnect 440

(or second word interconnect 442) and the bit interconnect 420 which are connected to the memory cell 100 desired to be selected, and a voltage is further applied between the first control interconnect 430 and the source interconnect 410 which are connected to the memory cell 100. Thereby, information is written into the selected memory cell 100. At this time, as shown in FIG. 1, since the disconnection portions are respectively formed in the first control gate 120, the third control gate 130, the second control gate 150, and the fourth control gate 160, the voltage from the first control interconnect 430 is not applied to another memory cell 100 located next to the selected memory cell 100. Therefore, it is possible to prevent erroneous writing from being performed in another memory cell 100 located next to the selected memory cell 100.

Figure 7:
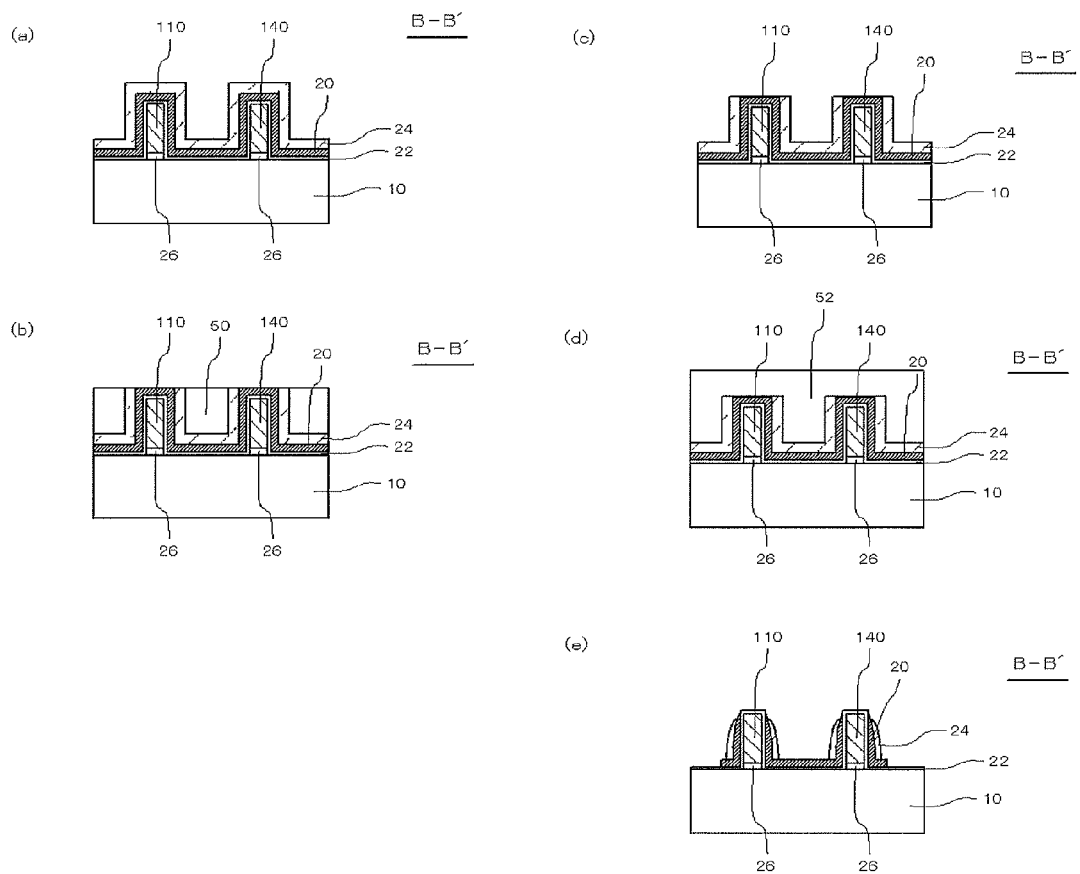
FIG. 7 is a cross-sectional view taken along line B-B' of FIGS. 9 and 11.
Figure 9:
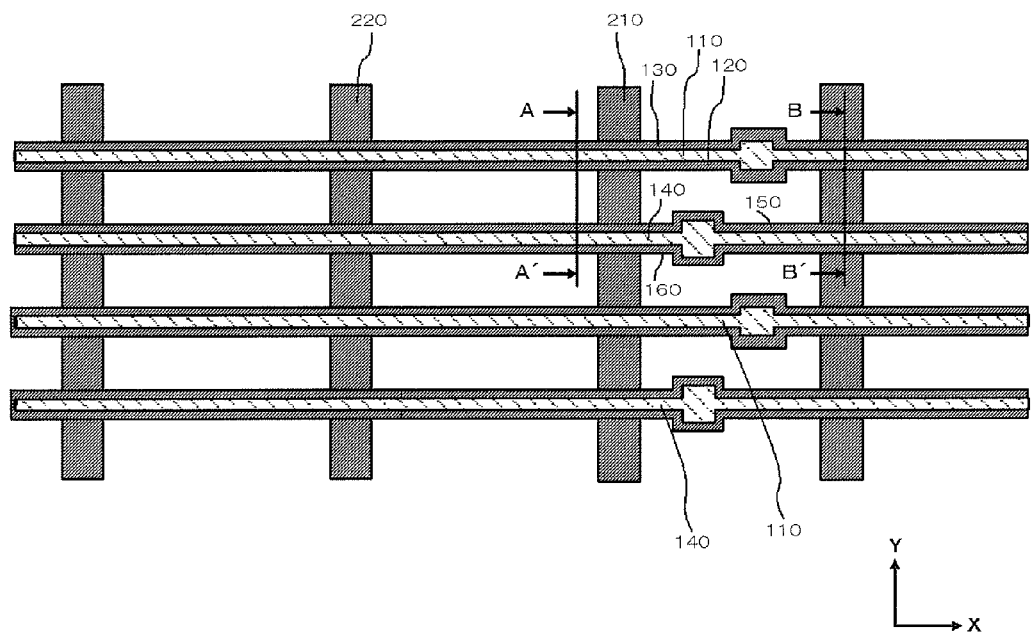
FIG. 9 is a plan view in a state of FIG. 8(b).

Next, a method for manufacturing a semiconductor device shown in FIG. 1 will be described with reference to FIGS. 7 to 11. FIGS. 9 and 11 are plan views, FIG. 7 is a cross-sectional view taken along line B-B' of FIGS. 9 and 11, and FIGS. 8 and 10 are cross-sectional views taken along line A-A' of FIGS. 9 and 11. In addition, FIG. 9 is a plan view in a state of FIG. 8(b), and FIG. 11 is a plan view in a state of FIG. 10.

First, as shown in FIG. 7(a), an insulating film serving as a word gate insulating film is formed on the substrate 10, a conductive film, for example, a polysilicon film is further sequentially laminated thereon, and the conductive film is selectively removed. Thereby, the first word gate 110 and the second word gate 140 are formed. The gate insulating film is selectively removed using the first word gate 110 and the second word gate 140 as a mask. Thereby, a word gate insulating film 26 is formed between the first word gate 110 and the substrate 10, and between the second word gate 140 and the substrate 10. Next, an ONO film 22 which is a laminated film of an oxide film, a nitride film, and an oxide film is formed on the first word gate 110 and the second word gate 140, and on the substrate 10. As the ONO film, a laminated film in which a silicon oxide film $SiO_2$, SiN, and a silicon oxide film $SiO_2$ are sequentially laminated is exemplified. Next, a conductive film 20 is formed on the ONO film 22. The conductive film 20 is a film serving as the first control gate 120, the third control gate 130, the second control gate 150, fourth control gate 160, the first connection portion 210, and the second connection portion 220. The conductive film 20 is, for example, a polysilicon film. Next, an insulating film 24 is formed on the conductive film 20. The insulating film 24 is, for example, a silicon oxide film.

Next, a non-photosensitive insulating film, for example, an antireflection film 50 is applied onto the insulating film 24. Thereafter, the antireflection film 50 and the insulating film 24 are etched back, and the upper surfaces of the first word gate 110 and the second word gate 140 are exposed. Thereby, the structure of FIG. 7(b) is formed.

Thereafter, as shown in FIG. 7(c), the antireflection film 50 is removed using an acid. Next, as shown in FIG. 7(d), a resist pattern 52 is formed, and the insulating film 24 is wet-etched using the resist pattern 52 as a mask. Thereafter, the resist pattern 52 is removed. Next, the conductive film 20 and the ONO film 22 are dry-etched using the patterned insulating film 24 as a mask. At this time, etch back is performed so that the conductive film 20 between the first word gate 110 and the second word gate 140 is left. Thereby, the structure of FIG. 7(e) is formed.

Next, a method for manufacturing a cross section taken along line A-A' of FIG. 9 will be described with reference to FIG. 8. As shown in FIG. 8(a), similarly to FIG. 7(a), the word gate insulating film 26, the first word gate 110, and the second word gate 140 are formed. Next, the ONO film 22 and the conductive film 20 are deposited. Thereafter, etch back is performed on the conductive film 20, to thereby form the first control gate 120, the third control gate 130, the second control gate 150, and the fourth control gate 160 which are shown in FIG. 8(b).

Figure 10:
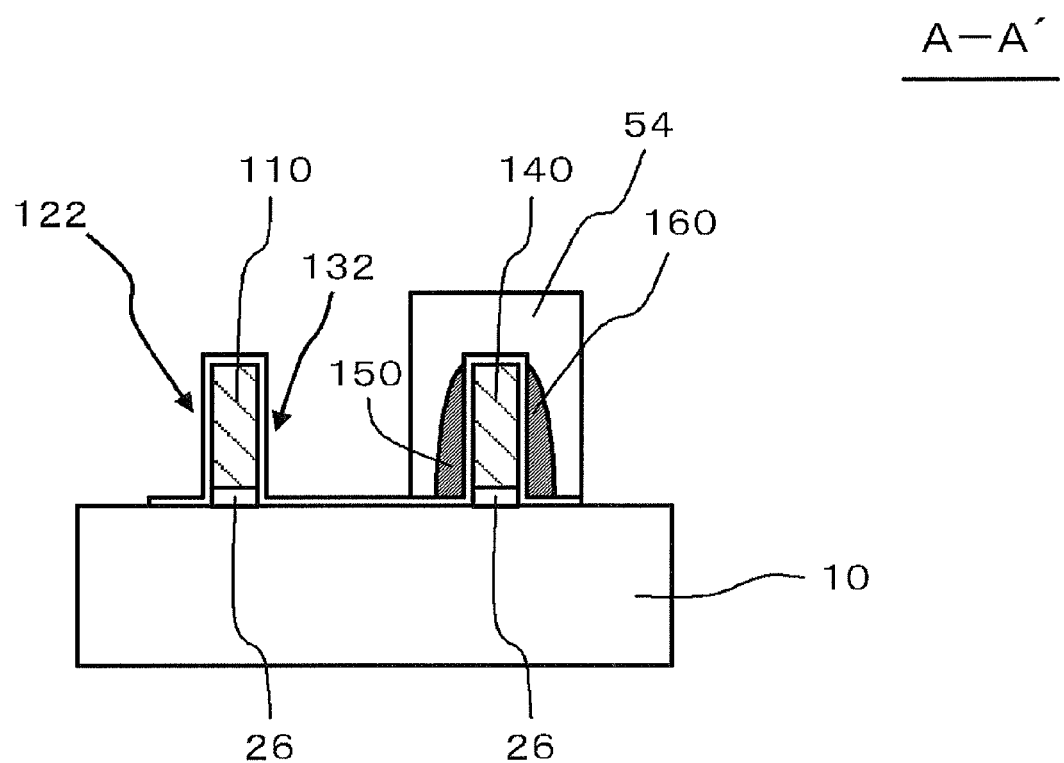
FIG. 10 is a cross-sectional view illustrating a method for manufacturing the semiconductor device shown in FIG. 1.
Figure 11:
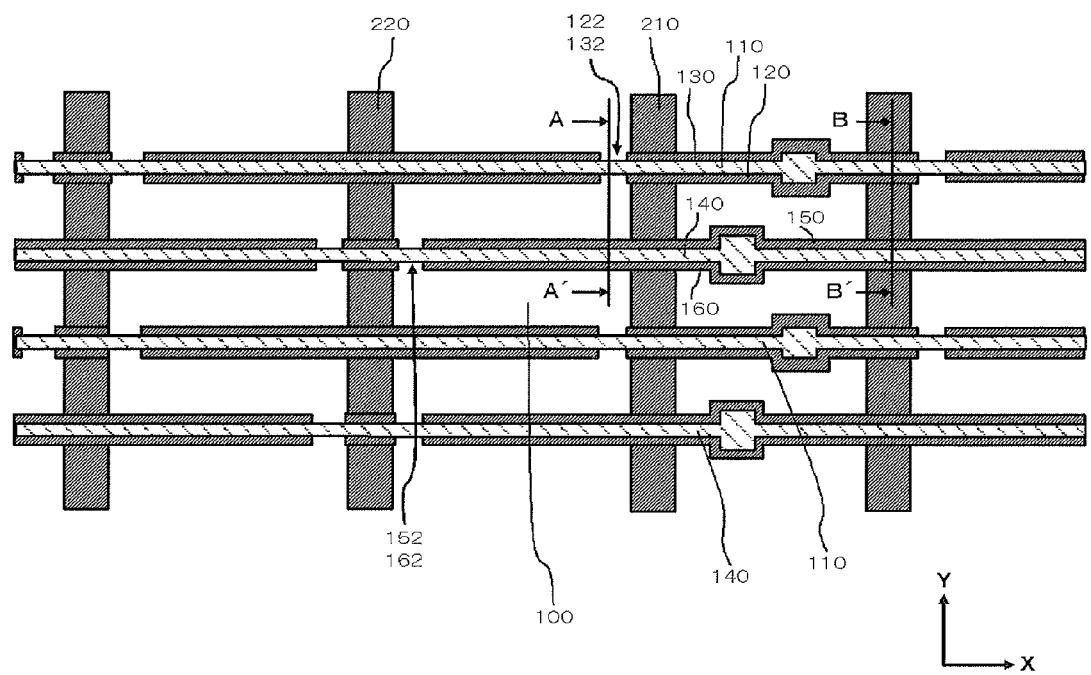
FIG. 11 is a plan view in a state of FIG. 10.

Thereafter, as shown in FIGS. 10 and 11, a resist pattern 54 is formed. The resist pattern 54 covers a region in which the first disconnection portion 122 is not formed in the first control gate 120, a region in which the third disconnection portion 132 is not formed in the third control gate 130, a region in which the second disconnection portion 152 is not formed in the second control gate 150, a region in which the fourth disconnection portion 162 is not formed in the fourth control gate 160, the first connection portion 210, and the second connection portion 220.

Meanwhile, the resist pattern 54 also does not cover a region interposed between the first disconnection portion 122 and the third disconnection portion 132 in the first word gate 110, and also does not cover a region interposed between the second disconnection portion 152 and the fourth disconnection portion 162 in the second word gate 140. In this manner, it is possible to increase a margin regarding position aberration when the resist pattern 54 is formed.

Next, etching is performed using the resist pattern 54 as a mask. Thereby, the first control gate 120, the third control gate 130, the second control gate 150, and the fourth control gate 160 are partially removed, and the first disconnection portion 122, the third disconnection portion 132, the second disconnection portion 152, and the fourth disconnection portion 162 are formed. Meanwhile, in this process, the portion interposed between the first disconnection portion 122 and the third disconnection portion 132 in the first word gate 110 is protected by the ONO film 22 and thus is not removed. In addition, the portion interposed between the second disconnection portion 152 and the fourth disconnection portion 162 in the second word gate 140 is also protected by the ONO film 22 and thus is not removed.

Meanwhile, in the state shown in FIG. 9, the conductive film 20 remains even in the end face of the first word gate 110. For this reason, the first control gate 120 and the third control gate 130 are in electrical conduction with each other due to the conductive film 20 remaining in this end face. Similarly, the conductive film 20 also remains in the end face of the second word gate 140. For this reason, in this state, the second control gate 150 and the fourth control gate 160 cause electrical conduction with each other due to the conductive film 20 remaining in this end face.

Consequently, as shown in FIG. 12(a), in the processes of forming the first disconnection portion 122, the third disconnection portion 132, the second disconnection portion 152, and the fourth disconnection portion 162, the ends of the first word gate 110 and the second word gate 140 are exposed from the resist pattern 54. For this reason, as shown in FIG. 12(b), when etching for forming the first disconnection portion 122, the third disconnection portion 132, the second disconnection portion 152, and the fourth disconnection portion 162 is performed, the conductive film 20 remaining in the end faces of the first word gate 110 and the second word gate 140 is removed. Thereby, the first control gate 120 and the third control gate 130 are isolated from each other, and the second control gate 150 and the fourth control gate 160 are isolated from each other.

Thereafter, the resist pattern 54 is removed. Next, impurities are selectively implanted into the substrate 10. Thereby, the bit diffusion layer 170, the source diffusion layer 180, and the dummy diffusion layers 182 and 184 are formed. Thereafter, an insulating interlayer and each contact are formed.

Next, the operation and effect of the embodiment will be described. In the embodiment, the first control gate 120 includes the first disconnection portion 122, and the second control gate 150 includes the second disconnection portion 152. Therefore, a potential can be applied to the first control gate 120 and the second control gate 150 separately. When writing into the memory cell 100 is performed, a voltage is not applied to a control gate of the memory cell 100 which is connected to a word gate disposed next to a word gate to which the memory cell 100 to be written is connected. Therefore, it is possible to prevent erroneous writing from being performed on the next memory cell 100. In addition, the first word gate 110 is not disconnected in the portion overlapping the first disconnection portion 122, and the second word gate 140 is not disconnected in the portion overlapping the second disconnection portion 152. For this reason, as compared with a case where the first word gate 110 and the second word gate 140 are disconnected, it is possible to reduce the number of first word contacts 310 connected to the first word gate 110, and to reduce the number of second word contacts 320 connected to the second word gate 140. Therefore, it is possible to reduce the size of the semiconductor device while suppressing erroneous writing into the memory cell 100.

Second Embodiment

Figure 13:
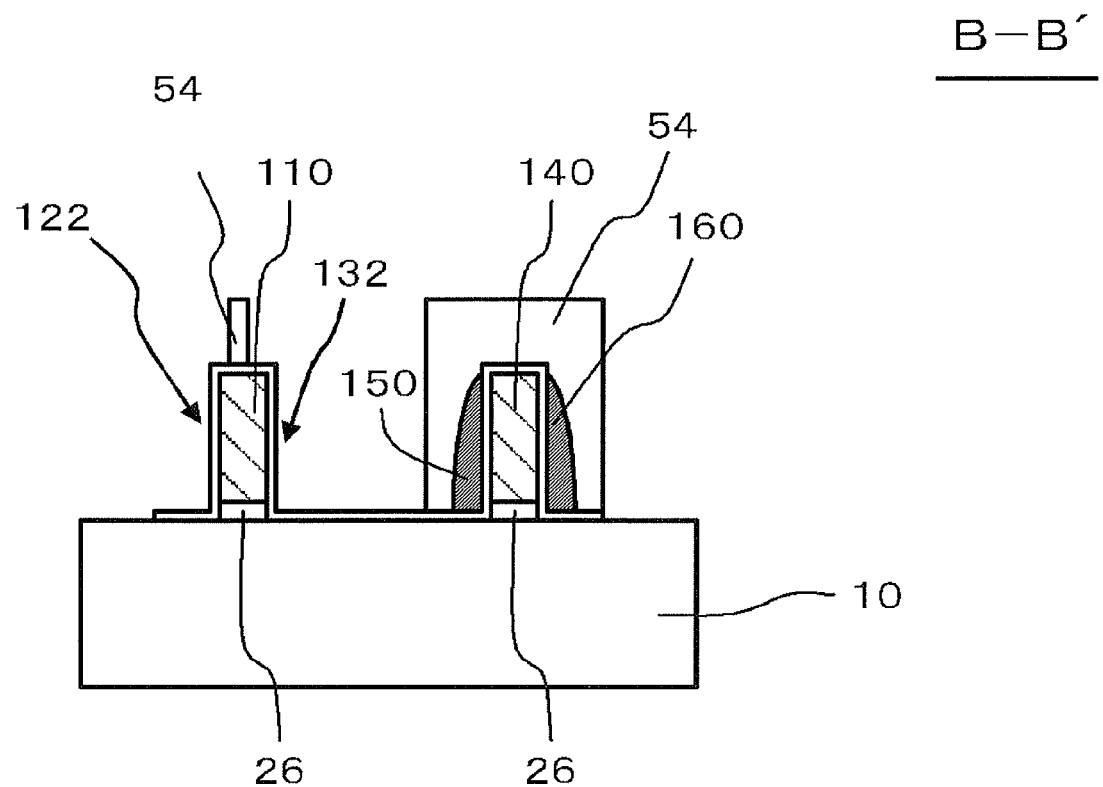
FIG. 13 is a cross-sectional view illustrating a method for manufacturing a semiconductor device according to a second embodiment.

FIG. 13 is a cross-sectional view illustrating a method for manufacturing a semiconductor device according to a second embodiment, and corresponds to FIG. 10 in the first embodiment. The method for manufacturing a semiconductor device according to the embodiment is the same as the method for manufacturing a semiconductor device according to the first embodiment, except that the resist pattern 54 covers the region interposed between the first disconnection portion 122 and the third disconnection portion 132 in the first word gate 110, and also covers the region interposed between the second disconnection portion 152 and the fourth disconnection portion 162 in the second word gate 140.

In the embodiment, the same effect as that in the first embodiment can also be obtained. In addition, in the etching processes when the first disconnection portion 122, the third disconnection portion 132, the second disconnection portion 152, and the fourth disconnection portion 162 are formed, the resist pattern 54 covers the region interposed between the first disconnection portion 122 and the third disconnection portion 132 in the first word gate 110, and also covers the region interposed between the second disconnection portion 152 and the fourth disconnection portion 162 in the second word gate 140. For this reason, it is possible to suppress damage to the first word gate 110 and the second word gate 140 during the etching process.

Third Embodiment

Figure 14:
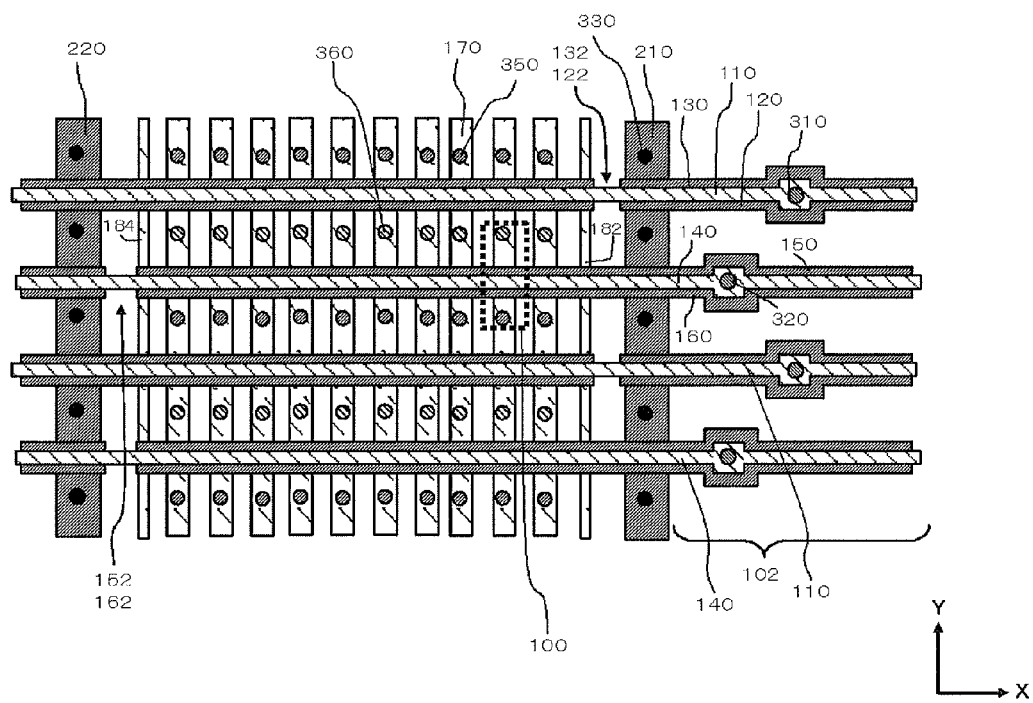
FIG. 14 is a plan view illustrating a configuration of a semiconductor device according to a third embodiment.

FIG. 14 is a plan view illustrating a configuration of a semiconductor device according to a third embodiment, and is equivalent to FIG. 1 in the first embodiment. The semiconductor device according to the embodiment has the same configuration as that of the semiconductor device according to the first embodiment, except for the following point.

First, the contact formation region 102 and the first connection portion 210 are disposed at one end side of the first word gate 110 and the first control gate 120, and the second connection portion 220 is disposed at the other end side. Meanwhile, in FIG. 14, the contact formation region 102 is disposed closer to one end of the first word gate 110 and the first control gate 120 than the first connection portion 210, but the positional relationship between the contact formation region 102 and the first connection portion 210 may be reversed.

That is, in the embodiment, only a set of the first connection portion 210 and the second connection portion 220 are provided in the X direction. A plurality of bit diffusion layers 170 and source diffusion layers 180 are provided between the set of the first connection portion 210 and the second connection portion 220.

In the embodiment, the same effect as that in the first embodiment can also be obtained. In addition, since the numbers of contact formation regions 102, first connection portions 210, and second connection portions 220 can be reduced, it is possible to reduce the size of the semiconductor device.

Fourth Embodiment

Figure 15:
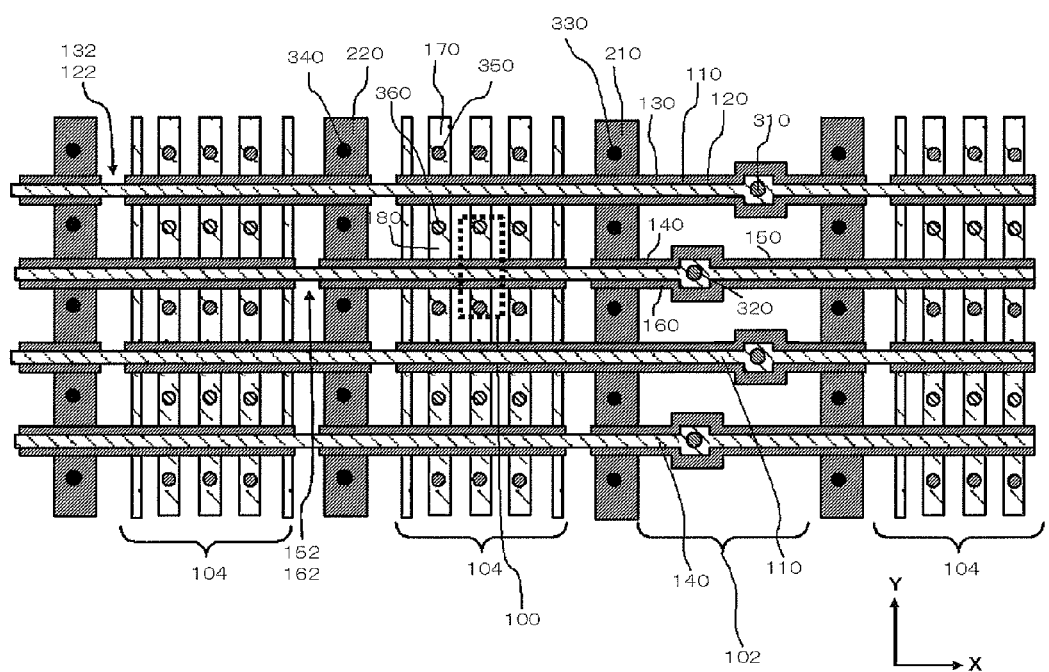
FIG. 15 is a plan view illustrating a configuration of a semiconductor device according to a fourth embodiment.

FIG. 15 is a plan view illustrating a configuration of a semiconductor device according to a fourth embodiment, and is equivalent to FIG. 1 in the first embodiment. The semiconductor device according to the embodiment has the same configuration as that of the semiconductor device according to the first embodiment, except for the following point.

Specifically, in the first embodiment, the memory cell regions 104 adjacent to each other with the second connection portion 220 interposed therebetween have layouts line-symmetric to each other. On the other hand, in the embodiment, any of the memory cell regions 104 have the same layout.

In the embodiment, the same effect as that in the first embodiment can also be obtained.

As described above, although the embodiments of the invention have been set forth with reference to the drawings, they are merely illustrative of the invention, and various configurations other than those stated above can be adopted.

This application claims priority from Japanese Patent Application No. 2011-66604 filed on Mar. 24, 2011, the content of which is incorporated herein by reference in its entirety.

The invention claimed is:

1. A semiconductor device comprising:
a substrate;
a first word gate formed over the substrate;
a second word gate, formed over the substrate, which extends parallel to the first word gate;
a first control gate formed at a lateral side facing the second word gate in the first word gate;
a second control gate formed at a lateral side facing the first word gate in the second word gate;
a first connection portion and a second connection portion, formed over the substrate, which connect the first control gate and the second control gate, and are separated from each other; and
at least one diffusion layer, formed in a region located between the first connection portion and the second connection portion in the substrate, which extends from the first control gate to the second control gate,
wherein the first control gate includes a first disconnection portion between the first connection portion and the diffusion layer closest to the first connection portion,
the second control gate includes a second disconnection portion between the second connection portion and the diffusion layer closest to the second connection portion,
the first word gate is not disconnected in a portion overlapping the first disconnection portion, and
the second word gate is not disconnected in a portion overlapping the second disconnection portion.

2. The semiconductor device according to claim 1, further comprising:
- a third control gate formed at a lateral side at which the first control gate is not formed in the first word gate; and
- a fourth control gate formed at a lateral side at which the second control gate is not formed in the second word gate,
- wherein the third control gate includes a third disconnection portion at the same position as that of the first disconnection portion in a direction in which the first control gate extends, and
- the fourth control gate includes a fourth disconnection portion at the same position as that of the second disconnection portion in a direction in which the second control gate extends.

3. The semiconductor device according to claim 2, wherein the first word gate and the second word gate are repeatedly disposed in this order,
- the first control gate and the third control gate are formed in each of a plurality of the first word gates,
- the second control gate and the fourth control gate are formed in each of a plurality of the second word gates, and
- the semiconductor device further comprises a third connection portion and a fourth connection portion, formed over the substrate, which connect the third control gate and the fourth control gate facing each other, and are separated from each other.

4. The semiconductor device according to claim 1, wherein a plurality of the first connection portions and a plurality of the second connection portions are alternately provided along an extending direction of the first control gate,
- the first disconnection portion is provided in the first control gate with respect to the plurality of the first connection portions, and
- the second disconnection portion is provided in the second control gate with respect to the plurality of the second connection portions.

5. The semiconductor device according to claim 1, wherein the first connection portion is provided on one end of the first control gate and the second control gate, and
- the second connection portion is provided on the other end of the first control gate and the second control gate.

6. The semiconductor device according to claim 5, further comprising:
- a first word contact provided on at least one end of the first word gate; and
- a second word contact provided on at least one end of the second word gate,
- wherein the first word contact and the second word contact are not provided between the first connection portion and the second connection portion.

7. A method for manufacturing a semiconductor device, comprising:
- forming a first word gate and a second word gate over a substrate;
- forming a conductive film over the substrate, the first word gate, and the second word gate;
- forming a first mask film over the conductive film, and etching the conductive film using the first mask film as a mask, to form a first control gate located at a lateral side facing the second word gate in the first word gate, a second control gate located at a lateral side facing the first word gate in the second word gate, and a first connection portion and a second connection portion that connect the first control gate and the second control gate and are separated from each other;
- forming a second mask film that covers the first connection portion and the second connection portion, and partially covers the first control gate and the second control gate;
- performing etching using the second mask film as a mask, to form a first disconnection portion located between the first connection portion and the second connection portion in the first control gate, form a second disconnection portion located between the first connection portion and the second connection portion in the second control gate, and not to disconnect the first word gate and the second word gate; and
- introducing impurities selectively in a region located between the first connection portion and the second connection portion in the substrate, to form at least one diffusion layer extending from the first control gate to the second control gate,
- wherein the first disconnection portion is located between the first connection portion and the diffusion layer closest to the first connection portion, and
- the second disconnection portion is located between the second connection portion and the diffusion layer closest to the second connection portion.

8. The method for manufacturing a semiconductor device according to claim 7, wherein in the forming of the first control gate and the second control gate,
- a third control gate is formed at a lateral side which is on the opposite side to the first control gate in the first word gate, and a fourth control gate is formed at a lateral side which is on the opposite side to the second control gate in the second word gate, and
- the first control gate is connected to the third control gate at an end of the first word gate, and the second control gate is connected to the fourth control gate at an end of the second word gate, and
- in the forming of the second disconnection portion, a connection portion between the first control gate and the third control gate at the end of the first word gate is removed, and a connection portion between the second control gate and the fourth control gate at the end of the second word gate is removed.

9. The method for manufacturing a semiconductor device according to claim 7, wherein in the forming of the second mask film,
- a region located at the same position as that of the first disconnection portion in an extending direction of the first word gate in the first word gate is covered with the second mask film, and
- a region located at the same position as that of the second disconnection portion in an extending direction of the second word gate in the second word gate is covered with the second mask film.

* * * * *